United States Patent
Gupta et al.

(10) Patent No.: US 7,633,787 B2
(45) Date of Patent: Dec. 15, 2009

(54) ROM MEMORY COMPONENT FEATURING REDUCED LEAKAGE CURRENT, AND METHOD FOR WRITING THE SAME

(75) Inventors: Siddarth Gupta, Bangalore (IN); Jean-Yves Larguier, Xi'an (CN); Gunther Lehmann, Holzkirchen (DE); Yannick Martelloni, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/661,582

(22) PCT Filed: Aug. 18, 2005

(86) PCT No.: PCT/EP2005/008952

§ 371 (c)(1),
(2), (4) Date: Sep. 26, 2007

(87) PCT Pub. No.: WO2006/024403

PCT Pub. Date: Mar. 9, 2006

(65) Prior Publication Data

US 2008/0212356 A1  Sep. 4, 2008

(30) Foreign Application Priority Data

Aug. 30, 2004  (DE) .................. 10 2004 042 105

(51) Int. Cl.
*G11C 17/00* (2006.01)

(52) U.S. Cl. ............... 365/94; 365/185.01; 365/185.24; 365/185.25; 365/189.01

(58) Field of Classification Search ........... 365/94, 365/185.01, 185.24, 185.25, 189.01
See application file for complete search history.

(56) References Cited

U.S. PATENT DOCUMENTS

| | | | |
|---|---|---|---|
| 4,912,674 A | | 3/1990 | Matsumoto et al. |
| 5,255,235 A | * | 10/1993 | Miyatake .................. 365/207 |
| 5,812,461 A | | 9/1998 | Komarek et al. |
| 5,936,883 A | * | 8/1999 | Kurooka et al. ........ 365/185.01 |
| 6,549,449 B2 | * | 4/2003 | Takashima .................. 365/149 |
| 6,711,058 B1 | | 3/2004 | Hirano |
| 7,016,216 B2 | * | 3/2006 | Oikawa et al. ............. 365/145 |
| 2001/0053107 A1 | | 12/2001 | Kohno |
| 2004/0022084 A1 | | 2/2004 | Sung et al. |
| 2004/0151045 A1 | * | 8/2004 | Kanai ......................... 365/203 |

FOREIGN PATENT DOCUMENTS

| | | |
|---|---|---|
| DE | 103 35 385 A1 | 2/2004 |
| EP | 0280883 A2 | 1/1988 |
| WO | WO 03/071553 A1 | 8/2003 |

* cited by examiner

*Primary Examiner*—Connie C Yoha
(74) *Attorney, Agent, or Firm*—Maginot, Moore & Beck

(57) ABSTRACT

The invention relates to a ROM memory cell comprising a first terminal connected to a word line, comprising a second terminal and comprising a third terminal, the second terminal being connected to a bit line and/or the third terminal being connected to a supply line for precharging the third terminal. The ROM memory cell according to the invention is distinguished by the fact that the same reference potential is in each case applied to the first terminal, the second terminal and/or the third terminal in a standby operating mode. The invention furthermore relates to a ROM memory component comprising such ROM memory cells, and to a method for reading from the ROM memory cell.

10 Claims, 4 Drawing Sheets

ROM MEMORY COMPONENT FEATURING REDUCED LEAKAGE CURRENT, AND METHOD FOR WRITING THE SAME

BACKGROUND

The invention relates to a ROM memory cell of the type mentioned in the preamble of Patent Claim 1. The invention furthermore relates to a ROM memory component, and to a method for reading from a ROM memory cell.

Semiconductor memories, that is to say semiconductor components comprising at least one memory cell, are used for storing information in digital systems. The semiconductor memories are subdivided into classes according to the type of information storage and the various possibilities for writing the information to the memory and reading it out again. If the memory retains the information even when the supply voltage is switched off, then this is referred to as a non-volatile memory or read-only memory, such as, for example, a ROM (Read Only Memory). The class of volatile memories includes static and dynamic memories, for example SRAM (Static Random Access Memory) or DRAM (Dynamic Random Access Memory), which can be written to and read from freely after production. In contrast thereto, mask-programmed ROM memories generally cannot be written to after production.

A conventional ROM memory component comprises a multiplicity of ROM memory cells each containing a transistor. The individual transistors of the ROM memory component are typically embodied as MOS transistors (Metal Oxide Semiconductor) and arranged in matrix-type fashion in a memory cell array of the ROM memory component. In this case, the source terminal of the transistor is connected to an earth voltage, the drain terminal of said transistor is optionally connected to a bit line and the gate terminal of said transistor is connected to a word line. A ROM memory component comprising such memory cells is described in the German Patent Application DE 103 35 385 A1, which forms the generic type.

In the standby operating mode, an earth potential is applied to the source terminal and the gate terminal of such a ROM memory transistor, while the positive supply potential is applied to the drain terminal. However, such memory cell architectures have relatively high leakage currents, that is to say parasitic currents, in the standby operating mode. Said leakage currents are attributable to various causes: the leakage current $I_{Gate}$ designates a parasitic current between the drain or source terminal and the gate terminal. The leakage current $I_{Junc}$ designates a parasitic current via the pn junction between the drain or source terminal and the substrate. The leakage current $I_{OFF}$ designates a parasitic current in the region of the channel of the transistor, that is to say between the latter's drain zone and source zone. These leakage currents are undesirable since, in the standby operating mode, in which the ROM memory cells are therefore not required, the latter nevertheless have a non-negligible current consumption which can rapidly exhaust the local power supply, particularly for mobile applications. For these reasons, consideration is increasingly being given to reducing the leakage currents in modern ROM memory cell architectures.

FIG. 1 shows the circuit diagram of a generally known leakage current optimized memory cell. FIG. 1a shows the associated signal-time diagrams.

FIG. 1 illustrates an individual memory transistor ST, the gate terminal G of which is connected to a word line WL, the drain terminal D of which is connected to a bit line BL and the source terminal S of which is connected to a supply line VL.

A positive supply potential VDD is applied to the supply line VL and to the bit line BL in the standby operating mode illustrated. The potential VSS=0 volts is applied to the word line WL in the standby operating mode. Although the ROM memory cell architecture in FIG. 1 permits the leakage current $I_{OFF}$ to be completely suppressed, the leakage current $I_{Gate}$ and $I_{Junc}$ is undesirably doubled by this memory cell architecture.

Modern memory technologies provide for increasing integration. In future memory generations produced using so-called deep-sub-micron technology, that is to say with feature sizes of 70 nm or less, the leakage current $I_{Gate}$, in particular, will increase greatly. This is due to the fact that with increasing integration the gate oxide becomes thinner and thinner, as a result of which the leakage current $I_{Gate}$ becomes greater and greater on account of tunnel effects through the gate oxide.

A further problem inherent to the known memory cell architecture according to FIG. 1 arises when reading from the ROM memory cell. Prior to the read-out of the information contained in the memory cell, the source terminal S connected to the supply line VL is firstly discharged, for example to the potential 0 volts, in order to activate the memory transistor ST during read-out via the word line WL and thus via its gate terminal G. In this case, the voltage $V_{GS}$ dropped between the gate terminal G and the drain terminal D, after the discharge of the source terminal S, should ideally be equal to the potential of the bit line BL, so that $V_{GS}=V_{DD}$ holds true. However, if the discharge of the source terminal S is not complete, for example in the case of a very high bit line capacitance, then the gate-source voltage $V_{GS}$ during read-out is rather $V_{GS}=V_{DD}-V_{VSS}$, where $V_{VSS}$ denotes the potential still remaining at the source terminal S after the discharge. Consequently, the memory transistor ST cannot be activated rapidly enough, which entails a lower read-out speed of the ROM memory cell.

SUMMARY

Taking this as a departure point, the present invention is based on the object of reducing the leakage current in a ROM memory cell or a corresponding ROM memory cell architecture, and in particular eliminating said leakage current as completely as possible.

Accordingly, provision is made of:

a leakage current optimized ROM memory cell comprising a first terminal connected to a word line, comprising a second terminal and comprising a third terminal, the second terminal being connected to a bit line and/or the third terminal being connected to a supply line for precharging the third terminal. The ROM memory cell is distinguished by the fact that the same reference potential is in each case applied to the first terminal, the second terminal and/or the third terminal in a standby operating mode. (Patent Claim 1)

A ROM memory component comprising at least one memory cell array, which in each case contains: a multiplicity of ROM memory cells, a multiplicity of word lines, a multiplicity of bit lines and a multiplicity of supply lines for precharging a terminal of one of the ROM memory cells, wherein the same reference potential is in each case applied to the word lines, the bit lines and the supply lines of a memory cell array in the standby operating mode. (Patent Claim 9)

A method for reading from a ROM memory cell having a controllable first, a second and a third terminal, in which an identical reference potential is applied to all the terminals or at least the first terminal and the second or the third terminal of the ROM memory cell in a standby operating mode, and in which, in a read operating mode for reading from the ROM memory cell, firstly the third terminal is precharged with a first potential, then and a second potential is applied to the first terminal, and, finally, the content of the memory cell is read out via the second terminal. (Patent Claim 13)

The idea on which the present invention is based consists in the same potential being applied to all the terminals of a memory cell in the standby operating mode. Consequently, in the case of a ROM memory transistor, the same reference potential is applied to said transistor's gate terminal (first terminal), via which the memory cell can be controlled into a read-out mode, and at least one of the two terminals of the controlled path of the memory transistor, that is to say the drain terminal (second terminal) thereof and/or the source terminal (third terminal) thereof depending on the programming. The particular advantage is that there is consequently no voltage drop between those terminals which have an identical potential, with the result that no leakage current can flow there either in the standby operating mode.

If, by way of example, in accordance with a first programming, the same reference potential is applied to all the terminals, that is to say gate terminal, drain terminal and source terminal, lack of a voltage drop between said terminals means that no leakage currents whatsoever flow either. In the case of a second programming, one of the terminals of the controlled path is not connected to the corresponding supply or bit line. The same reference potential is applied to the respective other terminal in the same way as the gate terminal, with the result that there is no voltage drop between said terminals and therefore no leakage current flows either. Consequently, the terminal not connected to a supply or bit line has as it were a floating potential, which is typically relatively near to the reference potential. This means that only minimal leakage currents can arise here as well.

Overall, this means that the leakage currents between the first, second and/or third terminals are eliminated to the greatest possible extent by means of the memory cell according to the invention. In the standby operating mode of the ROM memory cell, the latter is therefore (virtually) completely free of leakage current. This is highly advantageous for the total current consumption, particularly for mobile applications.

Advantageous configurations and developments of the invention emerge from the further subclaims and the description with reference to the drawing.

In one advantageous configuration, a field-effect-controllable transistor is provided as the memory transistor. It is particularly advantageous if said memory transistor is embodied as an N-channel transistor, in particular as an N-channel MOSFET.

Particularly when using a memory cell embodied as a MOS transistor, it has a fourth terminal, a so-called substrate terminal, which is connected to the substrate of the memory cell. Particularly in the case of MOS transistors, a reference potential is applied to the substrate and thus also the substrate terminal. Preferably, the same reference potential of the substrate terminal is applied to the first, second and third terminals in the standby operating mode.

In a typical configuration, a potential of 0 volts, that is to say the reference earth potential, is provided as the reference potential.

In the case of digitally embodied memories, a memory cell is in each case embodied for storing a first logic level or a second logic level. A logic level may be a logic high level ("1", high) or a logic low level ("0", low). During programming, for example by means of a mask programming, either a first or a second logic level is thereby assigned to a respective ROM memory cell.

Typically, in the case of a ROM memory cell designed for storing a first logic level, for example a high logic level, the second (drain) terminal is connected to the bit line and the third (source) terminal is connected to the supply line. In this case, all three terminals, that is to say gate, drain and source terminal, have the same reference potential. In the case of a ROM memory cell designed for storing a second logic level, for example a low logic level, the second (drain) terminal is not connected to the bit line. An alternative variant in which the third (source) terminal is isolated from the supply line would also be conceivable. Functionally there is no difference here since it suffices, in the case of this programming, for the controlled path (drain-source path) of the transistor always to be interrupted and therefore for no current whatsoever to flow between drain and source. This means that no signal either can be read out from the memory cell via the bit line. This is interpreted as the second logic level by a corresponding evaluation circuit.

In a highly advantageous configuration of the invention, the first logic level denotes a high logic level ("1") and the second logic level denotes a low logic level ("0"). In this case, then, a first data value "1" is programmed by establishing the discharge path through the transistor, and the second data value "0" is programmed by not establishing the discharge path through the transistor.

In one advantageous configuration of the ROM memory component according to the invention, a reference potential of 0 volts is applied to the word lines, the bit lines and the supply lines of a memory cell array operated in the standby operating mode.

In one advantageous configuration, a device for precharging the supply lines is provided. Said device is designed for charging, prior to a read-out or for a read-out operation of the memory cell, at least one supply line to a first potential, for example the positive supply potential, in order thereby to enable a read-out operation.

In a highly advantageous configuration, a column decoder or a bit line decoder is used as the device for precharging. The said bit line decoder, which selects a respective bit line via which the memory cell is to be read, is preferably additionally designed for precharging the corresponding supply line assigned to the same memory cell with a voltage potential. This constitutes a possibility which is very simple in terms of circuit technology, saves space and is advantageous from an energetic standpoint since a voltage potential is applied only to that supply line which is assigned to a memory cell that is respectively to be read. The remaining supply lines of other memory cell columns which are not intended to be read are not charged.

For reading from the various memory cells, a respective bit line is typically assigned at least one selection transistor, which is connected on the control side to a multiplexer circuit. The controlled path of said selection transistor is connected to the respective bit line, on the one hand, and is coupled to a read-out circuit, on the other hand. Since, on the bit line side, a reference potential of 0 volts is present in the standby operating mode and a rising potential is intended to be detected in the read-out mode, it is advantageous for said selection transistor to be embodied as an N-channel transistor. On account of their current-voltage characteristic curve, N-channel MOSFETs are better suited here than P-channel MOSFETs, since their drain terminal is nearer to the reference potential (that is to say to 0 volts) than to the operating potential ($V_{DD}$).

The use of NMOS transistors as selection transistors is advantageous in particular with regard to the area requirement. NMOS transistors have the particular advantage over PMOS transistors that they have an approximately three-fold smaller area requirement given the same saturation current on account of the differing mobility of holes and electrons. A significant saving of area can thereby be realized particularly when using a multiplicity of selection transistors, as is the case in memory components. Moreover, NMOS transistors can also be switched more rapidly, which leads directly to faster read-out speeds. As an alternative, it would also be conceivable, however, to use P-channel MOSFETs or a combination of P-channel and N-channel MOSFETs as selection transistors.

In one advantageous configuration of the method according to the invention, the first potential and the second potential are chosen to be identical. The two identical potentials designate in particular the operating potential, for example the positive supply potential.

In a further configuration of the method according to the invention, the word lines are selected by decoding of a row address and the bit lines and the supply lines are selected by decoding of a column address.

BRIEF DESCRIPTION OF THE DRAWINGS

The invention is explained in more detail below on the basis of the exemplary embodiments specified in the schematic figures of the drawing, in which.

DESCRIPTION

In the figures of the drawings, unless specified otherwise, identical elements and signals have been provided with the same reference symbols.

Figure 1:
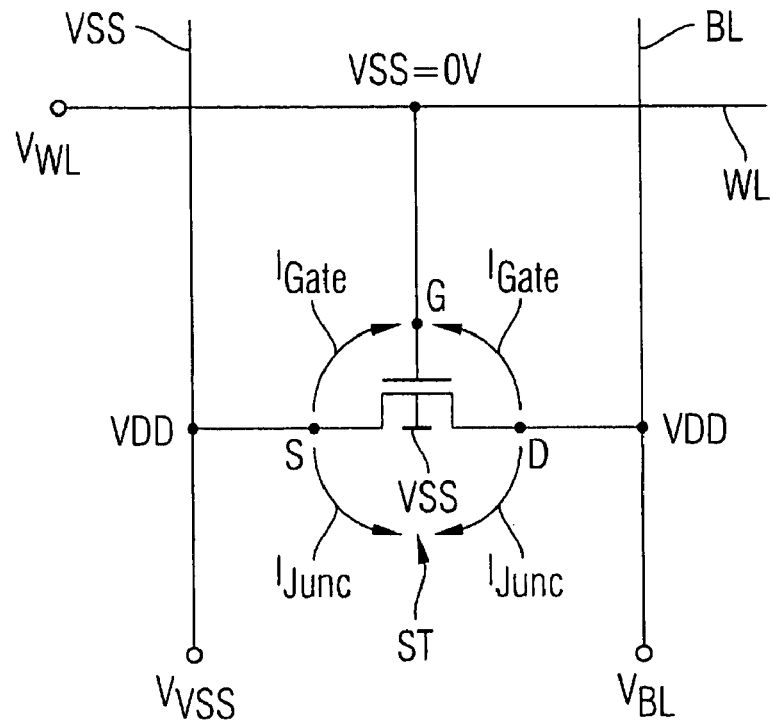
FIG. 1 shows the circuit diagram of a known ROM memory cell.
Figure 1A:
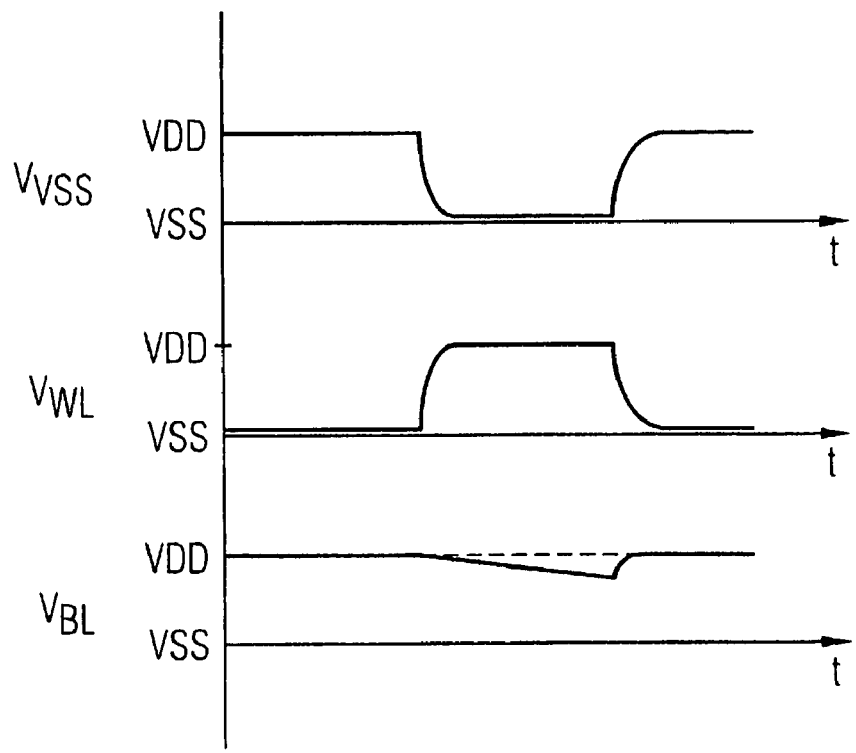
FIG. 1a shows the signal-time diagrams associated with the known ROM memory cell in FIG. 1.
Figure 2:
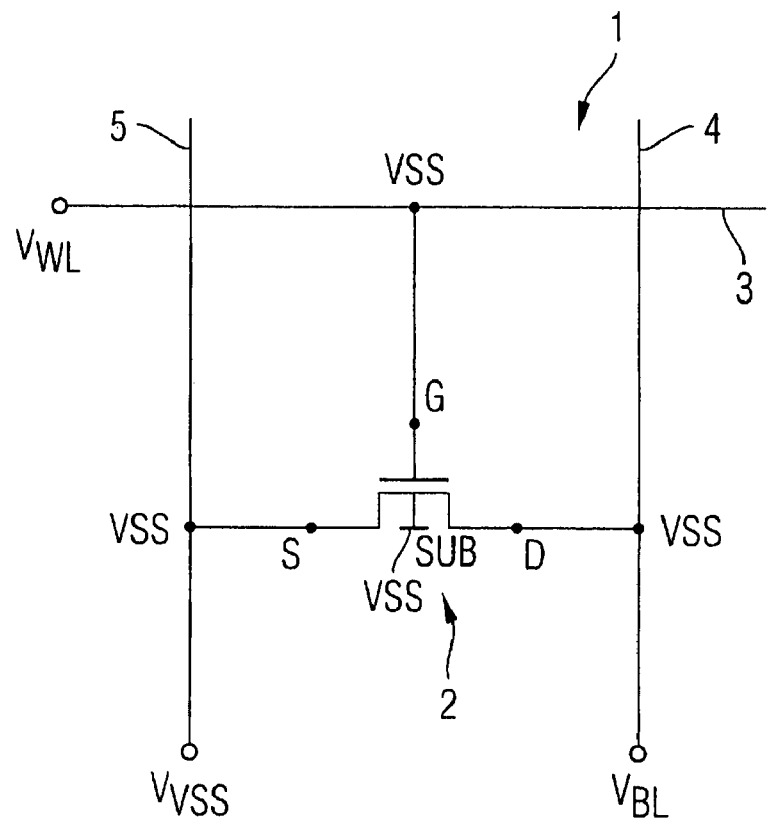
FIG. 2 shows the circuit diagram of a ROM memory cell according to the invention which is designed for storing a logic high level.

FIG. 2 shows the circuit diagram of a ROM memory cell according to the invention. In FIG. 2, the ROM memory cell according to the invention is designated by reference symbol 1. The memory cell 1 has a memory transistor 2, which is embodied as an N-channel MOSFET, NMOS transistor for short, in the present exemplary embodiment. The NMOS transistor 2 has, in a known manner, a gate terminal G for switching the memory transistor 2 on and off in a controlled manner, and also a source terminal S and a drain terminal D, between which the controlled path of the memory transistor 2 is present. The gate terminal G is connected to a word line 3, the drain terminal D is connected to a bit line 4 and the source terminal S is connected to a supply line 5. The memory transistor 2 furthermore has a substrate terminal SUB.

The memory cell 1 according to the invention in FIG. 2 is designed for storing a logic high level. Therefore, both the gate terminal G and the drain terminal D are connected respectively to the word line 3 and the bit line 4.

In the standby operating mode of the memory cell 1, the reference potential VSS, in the present case VSS=0 volts, is applied to the word line 3, the bit line 4 and to the supply line 5 and thus to the corresponding terminals G, D, S. Furthermore, the substrate terminal SUB is also at the reference potential VSS=0 volts. In the standby operating mode, the gate-source voltage VGS dropped between source terminal S and gate terminal G and also the drain-gate voltage VGD dropped between drain terminal D and gate terminal G are therefore equal to 0 volts. Since no voltage whatsoever is therefore dropped between said terminals, no leakage current whatsoever flows between gate and source and between gate and drain, irrespective of the thickness of the gate oxide of the memory transistor 2. In the standby operating mode, then, the current $I_{Gate}$=0 amperes or is at least negligibly low. Since, furthermore, the substrate SUB is likewise at a reference potential 0 volts, likewise no voltage is therefore dropped between the source terminal S and the substrate terminal SUB and between the drain terminal D and the substrate terminal SUB. Consequently, no leakage current whatsoever arises between source or drain terminal and the substrate either, with the result that it is also the case that the current $I_{Junc}$=0 amperes or is at least negligibly low.

Figure 2A:
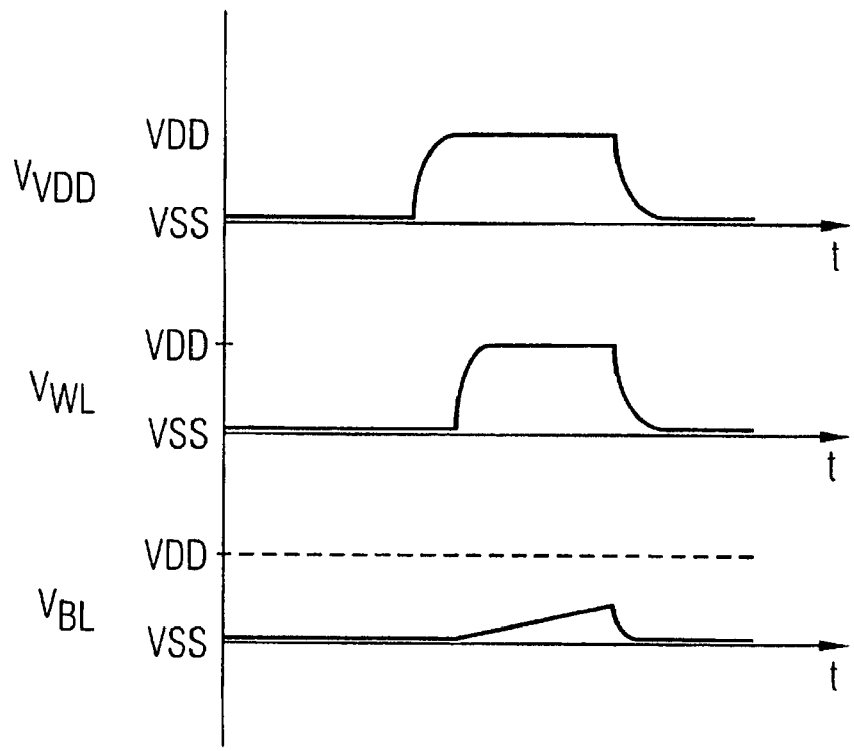
FIG. 2a shows the signal-time diagrams associated with the ROM memory cell in FIG. 2.

FIG. 2a shows the signal-time diagrams for a read-out operation of a ROM memory cell according to the invention in accordance with FIG. 2. The potential of the word line 3 is designated by $V_{WL}$, the potential of the bit line 4 is designated by $V_{BL}$ and the potential of the supply line 5 is designated by $V_{VDD}$. Prior to a read-out operation, as has already been set out with reference to FIG. 2, all the lines 3, 4, 5 are at a reference potential VSS=0 volts. In order to read out the information ("1") stored in the memory cell 1, the source terminal S is firstly precharged to a supply potential VDD via the supply line 5. After the precharging of the source terminal S or else already during the precharge operation, a supply potential VDD is likewise applied to the gate terminal G via the word line 3, whereby the memory transistor 2 is activated. On account of the voltage difference between source and drain, a drain-source current thus flows, which has the effect that the potential at the drain terminal D and hence at the bit line 4 rises increasingly. This rising potential can be read out via a sense amplifier, which interprets this signal as a high logic level.

Typically, the precharging of the source terminal S via the supply line 5, in particular on account of the line capacitances within a ROM memory arrangement, is relatively incomplete, which also directly has the effect that the potential at the drain terminal also does not rise completely to the supply potential VDD. Typically, however, a potential swing of approximately 10% VDD at the bit line already suffices in order that this signal can be interpreted as a logic high level or can be distinguished from a logic low level by the sense amplifier. Even if, during a read-out operation, the potential at the supply line 5 does not reach the ideal value of the operating potential VDD, the memory cell 1 has its maximum saturation current since the voltage $V_{GS}$ dropped between gate and source terminal G, S is equal to the operating voltage VDD.

Figure 3:
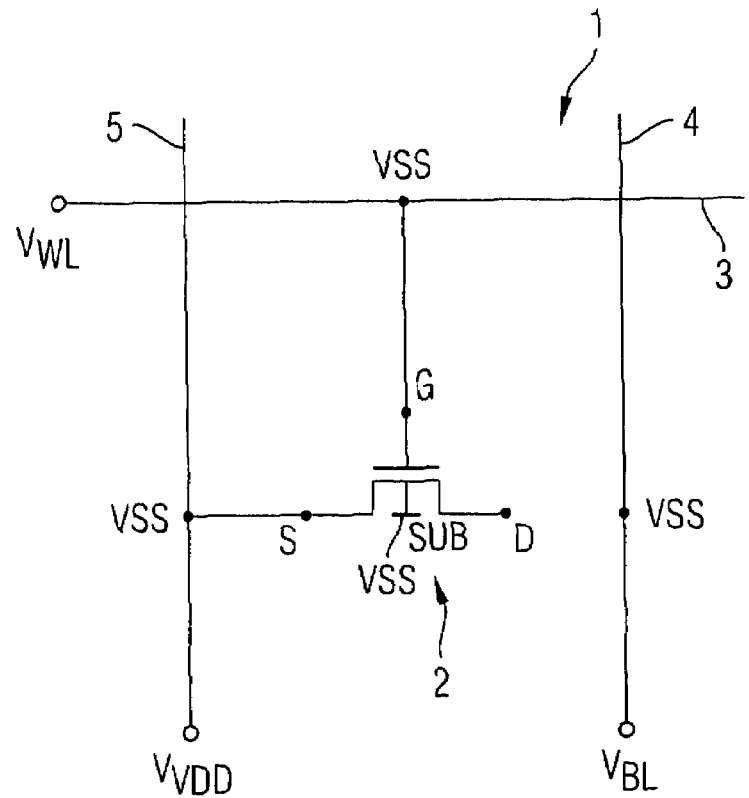
FIG. 3 shows the circuit diagram of a ROM memory cell according to the invention which is designed for storing a logic low level.
Figure 3A:
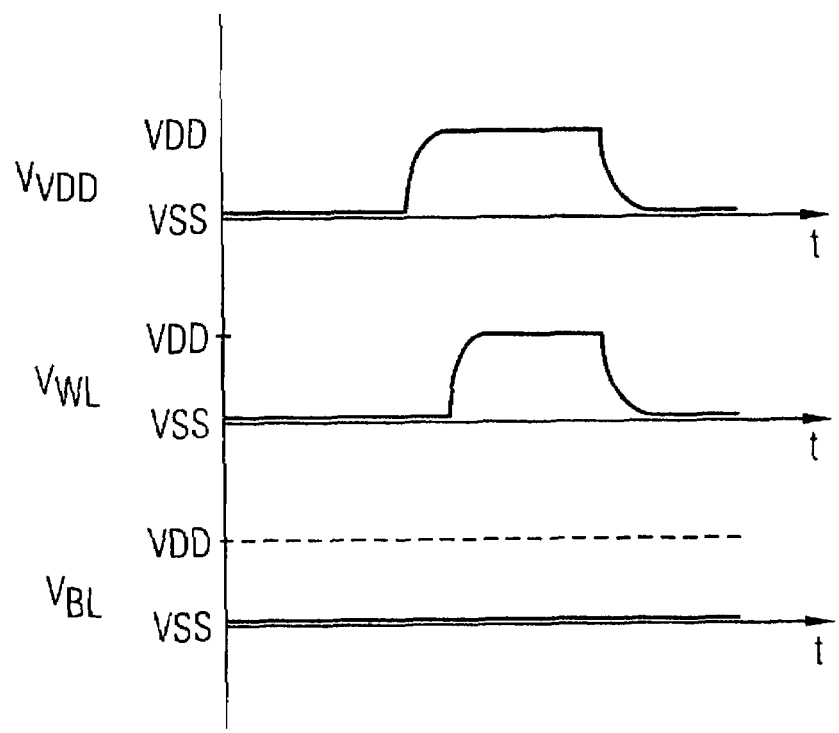
FIG. 3a shows the signal-time diagrams associated with the ROM memory cell in FIG. 3.

FIG. 3 shows a ROM memory cell according to the invention which is designed for storing a low logic level. FIG. 3a shows the associated signal-time diagram.

In contrast to the exemplary embodiment in FIG. 2, here the drain terminal D is not connected to the bit line 4. Consequently, the drain terminal D is as it were at a floating potential, typically at a potential near to the reference potential VSS on account of the substrate potential VSS. The source terminal S and the gate terminal G are furthermore at a reference potential of VSS=0 volts. As above in the exemplary embodiment of FIG. 2, no leakage current $I_{Gate}$ whatsoever arises between source and gate. In the same way, nor does a leakage current $I_{Junc}$ arise between the source terminal S and the substrate terminal SUB. Slight leakage currents $I_{Gate}$, $I_{Junc}$ arise only between the gate terminal G and the drain terminal D, on the one hand, and also between the drain terminal D and the substrate terminal SUB, which leakage currents are likewise negligibly low, however, on account of the fact that the drain terminal D has a floating potential near to the reference potential VSS.

For a read-out operation (see FIG. 3a), in a known manner firstly the supply line 5 is precharged with the supply potential VDD. Afterwards, the gate terminal G is charged with the supply potential VDD via the word line 3. Since the drain terminal D is not connected to the bit line 4, however, the bit line 4 remains at the reference potential VSS=0 volts, with the result that a sense amplifier interprets the content of said memory cell 2 as a low logic level.

Figure 4:
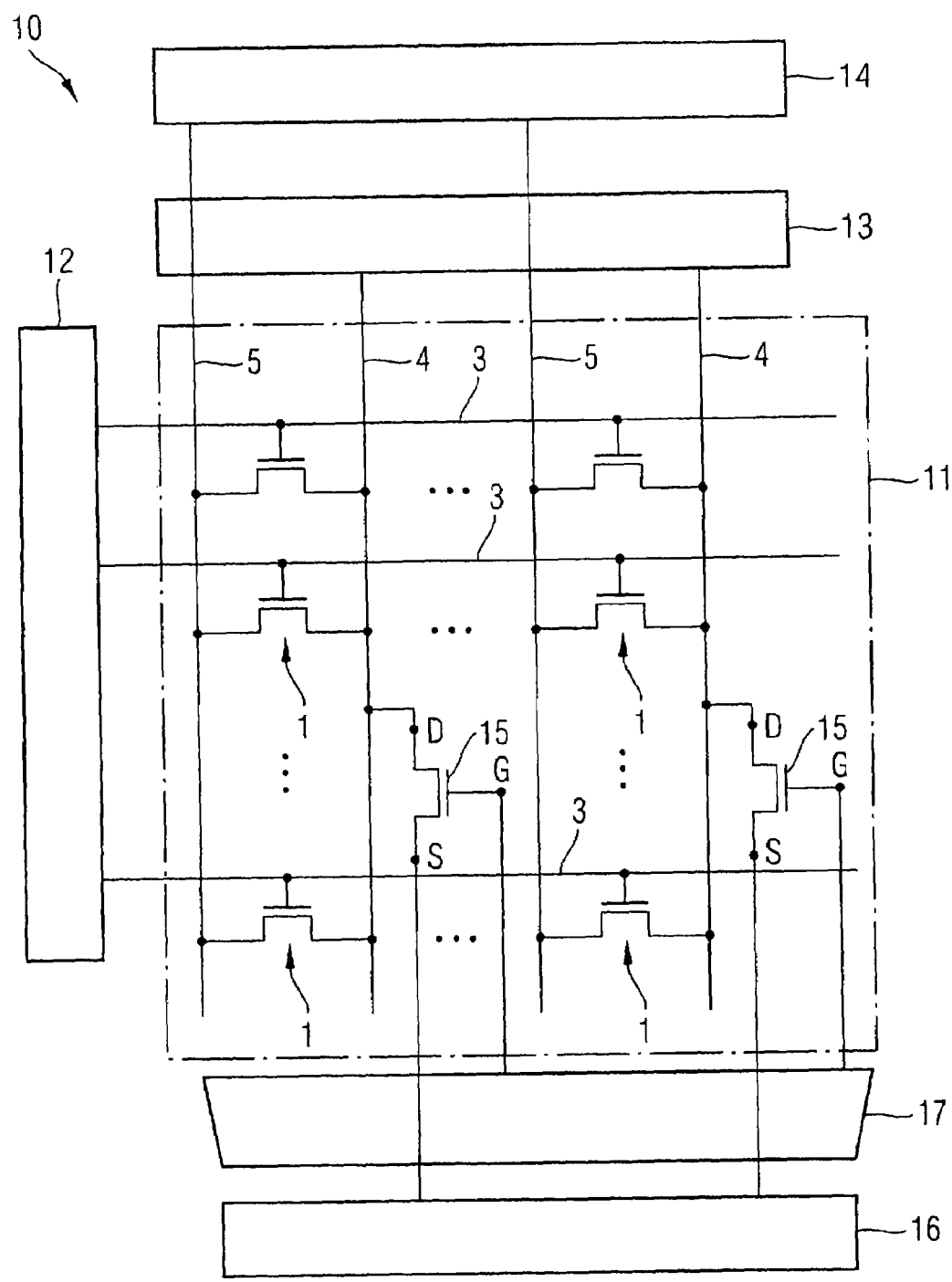
FIG. 4 shows a block diagram of a ROM memory component according to the invention comprising ROM memory cells according to the invention.

FIG. 4 shows a block diagram of a ROM memory component according to the invention comprising ROM memory cells according to the invention. FIG. 4 illustrates a ROM memory component merely schematically, that is to say not completely. The memory component 10 has a memory cell array 11 constructed from a multiplicity of ROM memory cells 1 according to the invention in the present exemplary embodiment. The memory cells 1 are arranged in matrix-type fashion in rows and columns in a known manner, each row being assigned a word line 3 and each column being assigned a bit line 4 and a supply line 5. The word lines 3 are connected to a row decoder 12, the bit lines 4 are connected to a column decoder 13 and the supply lines 5 are connected to a precharge circuit 14.

For a read-out operation, each bit line 4 is in each case assigned at least one selection transistor 15. In the present exemplary embodiment, the selection transistors 15 are embodied as N-channel MOSFETs in the same way as the transistors of the memory cell array 11. In this case, the drain terminal D of a selection transistor 15 is connected to a respective bit line 4. Consequently, a reference potential VSS (standby operating mode) or a potential in proximity to the reference potential VSS (read operating mode) is applied to the drain terminal D. The source terminal S of the selection transistor 15 is connected to a read-out circuit 16. For the selection of a respective bit line 4, that is to say for the selection of an individual or some specific bit lines 4 within the memory cell array 11, the gate terminal G is connected to a bit line multiplexer circuit 17. A respective selection transistor 15 assigned to a bit line 4 via which a ROM memory cell 1 is intended to be read can be switched on and off via said bit line multiplexer circuit 17.

Although the present invention has been described above on the basis of advantageous exemplary embodiments, it shall not be restricted thereto, but rather can be modified in diverse ways.

Thus, the invention shall not be restricted exclusively to the use of memory transistors or selection transistors embodied as NMOS transistors, but rather can, of course, also be extended to PMOS transistors. Other types of transistors, for example JFETs, bipolar transistors or the like, can, of course, also be used as memory transistors, even though MOSFETs are particularly well suited as memory transistors. Furthermore, a multiplicity of different exemplary embodiments can be specified by exchanging the conductivity types N for P and vice versa.

It goes without saying that the circuit topography of an individual ROM memory cell and also the circuit topography of a ROM memory component can be suitably modified or altered without departing from the essence of the invention.

The invention has been described such that a logic high level is defined by connection of all the terminals of the ROM memory transistor and a logic low level is defined by non-connection of the drain terminal to the bit line. An inverted logic would also be conceivable, of course. Furthermore, it would also be possible, instead of the non-connection of the drain terminal to the bit line, for the source terminal not to be connected to the supply line or additionally or alternatively also for the gate terminal not to be connected to the word line.

Moreover, instead of using a reference potential of 0 volts, a different reference potential would be conceivable, of course.

Even though only a single memory cell array of a ROM memory component is illustrated in FIG. 4, it goes without saying that a ROM memory component can be embodied with arbitrary complexity and may correspondingly have an arbitrary multiplicity of memory cell arrays.

Moreover, the invention shall not be restricted exclusively to mask-programmed ROM memories. Other types of programming, for example programming by means of a diffusion mask, would also be conceivable, of course.

The invention claimed is:

1. A ROM memory component comprising at least one memory cell array, each memory cell array comprising:
   a plurality of first ROM memory cells for storing a first logic level, each first ROM memory cell comprising a first terminal connected to a word line, a second terminal and a third terminal, wherein the second terminal is connected to a bit line and/wherein the third terminal is connected to a supply line for pre-charging the third terminal,
   a plurality of second ROM memory cells for storing a second logic level, each second ROM memory cell comprising a first terminal connected to a word line, a second terminal, and a third terminal, wherein either the second terminal is connected to a bit line or the third terminal is connected to a supply line, and wherein either the second terminal or the third terminal is floating,
   a plurality of word lines,
   a plurality of bit lines,
   a plurality of supply lines,
   wherein a first reference potential is in each case applied to the plurality of word lines, the plurality of bit lines and the plurality of supply lines of a memory cell array in a standby operating mode, such that for each first ROM memory cell the first reference potential is applied to all the terminals in the standby operating mode and for each second ROM memory cell the first reference potential is applied to the first terminal and to the terminal connected to the bit line or the supply line.

2. The ROM memory component according to claim 1, wherein in that each first ROM memory cell includes a memory transistor having a gate terminal defining the first terminal, a drain terminal defining the second terminal and a source terminal defining the third terminal.

3. The ROM memory component according to claim 2, wherein the memory transistor is embodied as an NMOS transistor.

4. The ROM memory component according to claim 1, wherein the memory transistor includes a fourth terminal comprising a substrate terminal of the memory transistor, and wherein the first reference potential is applied to the fourth terminal in the standby operating mode.

5. The ROM memory component according to claim 1, wherein a potential of 0 volts is provided as the first reference potential.

6. The ROM memory component according to claim 1, wherein the first logic level denotes a logic high level ("1") and a second logic level denotes a logic low level ("0").

7. The ROM memory component according to claim 1, wherein the memory cell has a reading operating mode that differs from the standby operating mode.

8. The ROM memory component according to claim 1, further comprising a precharging device to charge to a first potential, prior to a read-out of a first memory cell, at least the supply line corresponding to the first memory cell.

9. The ROM memory component according to claim 1, wherein a respective bit line is assigned at least one selection transistor having a controlled path, the at least one selection transistor connected on a control side to a multiplexer circuit and which is arranged with the controlled path between the bit line assigned to said selection transistor and a read-out circuit.

10. The ROM memory component according to claim 9, wherein the selection transistor comprises an NMOS transistor.

\* \* \* \* \*